(12) United States Patent
Jung (10) Patent No.: US 9,425,779 B2
(45) Date of Patent: Aug. 23, 2016

(54) DELAY CIRCUIT

(71) Applicant: SK hynix Inc., Gyeonggi-do (KR)

(72) Inventor: Inhwa Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/718,857

(22) Filed: May 21, 2015

(65) Prior Publication Data

US 2016/0182028 A1    Jun. 23, 2016

(30) Foreign Application Priority Data

Dec. 18, 2014 (KR) ................. 10-2014-0183579

(51) Int. Cl.
*H03H 11/26* (2006.01)
*H03K 5/14* (2014.01)
*H03K 5/00* (2006.01)

(52) U.S. Cl.
CPC ........ *H03K 5/14* (2013.01); *H03K 2005/00065* (2013.01)

(58) Field of Classification Search
CPC ......... H03K 5/13; H03K 5/131; H03K 5/133; H03K 5/134; H03K 5/14
USPC ........... 327/2, 3, 12, 261, 262, 276, 277, 278, 327/279, 281, 284, 285, 286, 288
See application file for complete search history.

(56) References Cited

U.S. PATENT DOCUMENTS

| 5,400,370 | A  | * | 3/1995  | Guo ....................... H03L 7/0814 375/359 |
| 6,327,318 | B1 | * | 12/2001 | Bhullar ................. H03L 7/0814 375/374 |
| 6,812,760 | B1 | * | 11/2004 | Kim ....................... H03L 7/0805 327/158 |
| 7,154,314 | B2 | * | 12/2006 | Lance ................. H04L 25/0292 327/108 |
| 7,952,404 | B2 | * | 5/2011  | Petrie ....................... H03L 7/07 327/149 |
| 8,125,257 | B2 | * | 2/2012  | Petrie ....................... H03L 7/07 327/149 |
| 8,564,345 | B2 |   | 10/2013 | Yu |

FOREIGN PATENT DOCUMENTS

KR    101068590    9/2011

\* cited by examiner

*Primary Examiner* — William Hernandez
(74) *Attorney, Agent, or Firm* — IP & T Group LLP (57) ABSTRACT

A delay circuit may include a delay path including a fine delay line and a coarse delay line, a replica delay path including a replica fine delay line and a replica coarse delay line, and a tuning unit that compares a phase of a first signal obtained by delaying an input signal through the delay path with a phase of a second signal obtained by delaying the input signal through the replica delay path, and generates a tuning code in a tuning mode.

16 Claims, 6 Drawing Sheets

DELAY CIRCUIT

CROSS-REFERENCE TO RELATED APPLICATIONS

The present application claims priority of Korean Patent Application No. 10-2014-0183579, filed on Dec. 18, 2014, which is incorporated herein by reference in its entirety.

BACKGROUND

1. Field

Exemplary embodiments of the present invention relate to a delay circuit and, more particularly, to a delay circuit including a coarse delay line and a fine delay line.

2. Description of the Related Art

A delay circuit is a circuit that delays an input signal for a predetermined time and outputs a delayed signal in order to match signal timing. Since various semiconductor devices operate in synchronization with unique operation sequences and timing, delay circuits are used extensively in semiconductor devices.

Figure 1:
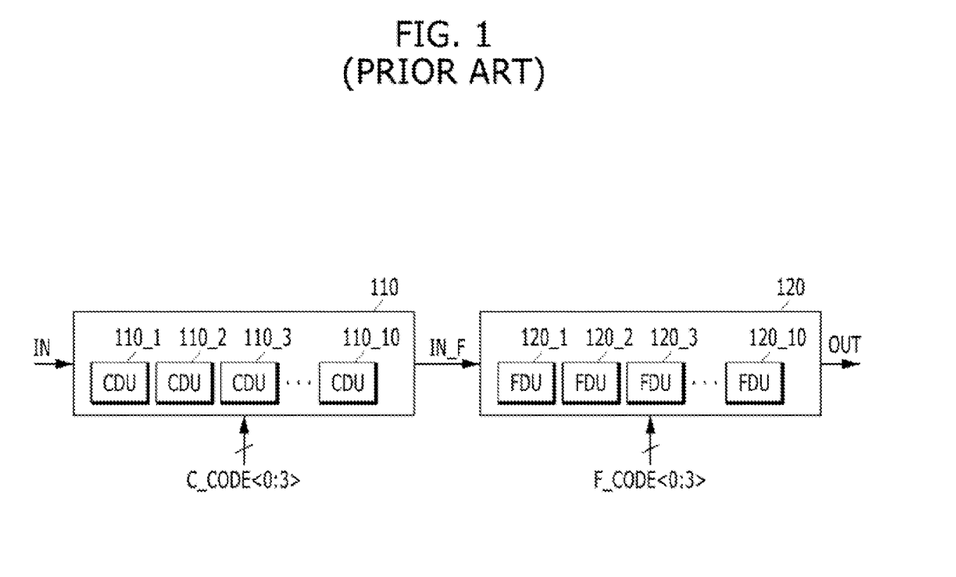
FIG. 1 is a configuration diagram of a conventional delay circuit.

FIG. 1 is a configuration diagram of a conventional delay circuit.

Referring to FIG, 1, the delay circuit includes a coarse delay line 110 and a fine delay line 120.

The coarse delay line 110 includes a plurality of coarse delay units (CDU) 110_1 to 110_10. Each of the coarse delay units 110_1 to 110_10 may have a large delay value. For example, each of the coarse delay units 110_1 to 110_10 may have a delay value of 10. Among the coarse delay units 110_1 to 110_10, the number of coarse delay units used to delay an input signal IN may be determined by coarse delay setting codes C_CODE<0:3>.

The fine delay line 120 includes a plurality of fine delay units (FDU) 120_1 to 120_10. Each of the fine delay units 120_1 to 120_10 may have a small delay value. For example, each of the fine delay units 120_1 to 120_10 may have a delay value of 1. Among the fine delay units 120_1 to 120_10, the number of fine delay units used to delay an input signal IN_F of the fine delay line 120 may be determined by fine delay setting codes F_CODE<0:3>.

The maximum delay value 10 of the fine delay line 120 is approximately equal to the delay value 10 of one of the coarse delay units 110_1 to 110_10. Accordingly the number of fine delay units used for delaying a signal in the fine delay line 120 and the number of coarse delay units used to delay a signal in the coarse delay line 110 are adjusted, so that the delay circuit may be set to have various delay values of 0 to 110.

In order to set the delay circuit to have one of the various delay values of 0 to 110, the maximum delay value of the fine delay line 120 should be approximately equal to the delay value of one of the coarse delay units 110_1 to 110_10. However, it is difficult to make the maximum delay value of the fine delay line 120 approximate the delay value of one of the coarse delay units 110_1 to 110_10 due to variables such as pressure, voltage, and temperature (PVT).

SUMMARY

Various embodiments are directed to a technology for adjusting a maximum delay value of a fine delay line to be approximately equal to a delay value of a coarse delay unit in a course delay line.

In an embodiment, a latch circuit may include a delay circuit with a delay path including a fine delay line and a coarse delay line, a replica delay path including a replica fine delay line and a replica coarse delay line, and a tuning unit suitable for comparing a phase of a first signal obtained by delaying an input signal through the delay path with a phase of a second signal obtained by delaying the input signal through the replica delay path, and generating a tuning code in a tuning mode.

In the tuning mode, the delay path and the replica delay path may be set as one of first and second ways (1) and (2), wherein, as the first way (1) the fine delay line is set as a maximum delay value thereof, and the coarse delay line is set as a delay value of N delay units thereof, and the replica fine delay line is set as a minimum delay value thereof, and the replica coarse delay line is set as a delay value of N+1 delay units thereof, wherein the N is an integer greater than or equal to 0, wherein, as the second way (2), the fine delay line is set as a minimum delay value thereof, and the coarse delay line is set as a delay value of N+1 delay units thereof, and the replica fine delay line is set as a maximum delay value thereof, and the replica coarse delay line is set as a delay value of N delay units thereof.

The delay values of the coarse delay line and the replica coarse delay line may be tuned by the tuning code. Each of the coarse delay line and the replica coarse delay line may include a to plurality of coarse delay units as a delay unit thereof, wherein a number of coarse delay units to be used in the delaying of the input signal among the plurality of coarse delay units may be determined by a corresponding coarse delay setting code, and a delay value of each of the plurality of coarse delay units may be adjusted by the tuning code. Each of the plurality of coarse delay units may include a plurality of capacitors, wherein a number of capacitors to be used in the delaying of the input signal among the plurality of capacitors may be determined by the tuning code.

In another embodiment, a delay circuit may include a first delay path including a first fine delay line and a first coarse delay line for delaying a first input signal and generating a first output signal, a second delay path including a second fine delay line and a second coarse delay line for delaying a second input signal and generating a second output signal, a replica delay path including a replica fine delay line and a replica coarse delay line for delaying the first input signal and generating a replica output signal, and a tuning unit suitable for comparing a phase of the first output signal with a phase of the replica output signal, and generates a tuning code for tuning delay values of the first coarse delay line, the second coarse delay line, and the replica coarse delay line in a tuning mode.

In the tuning mode, the first delay path and the replica delay path may be set as one of first and second ways (1) and (2), wherein, as the first way (1), the fine delay line is set as a maximum delay value thereof, and the coarse delay line is set as a delay value of N delay units thereof, and the replica fine delay line is set as a minimum delay value thereof, and the replica coarse delay line is set as a delay value of N+1 delay units thereof, wherein the N is an integer equal or more than 0, wherein, as the second way (2), the fine delay line is set as a minimum delay value thereof, and the coarse delay line is set as a delay value of N+1 delay units thereof, and the replica fine delay line is set as a maximum delay value thereof, and the replica coarse delay line is set as a delay value of N delay units thereof.

Each of the first coarse delay line, the second coarse delay line, and the replica coarse delay line may include a plurality of coarse delay units as a delay unit thereof, wherein a number of coarse delay units to be used in the delay of the first or second input signal among the plurality of coarse delay units may be determined by a corresponding coarse delay setting code, and a delay value of each of the plurality of coarse delay units may be adjusted by the tuning code. Each of the plurality of coarse delay units may include a plurality of capacitors wherein a number of capacitors to be used in the delay of the first or second input signal among the plurality of capacitors may be determined by the tuning code.

In a further embodiment, a delay circuit may include a delay path including a fine delay line and a coarse delay line, wherein the coarse delay unit including a plurality of delay units and the fine delay line corresponds to one of the delay units, a replica delay path including a replica fine delay line and a replica coarse delay line and configured approximately the same as the delay path, and a tuning unit suitable for comparing output signals of the delay path and the replica delay path and generating a tuning code for tuning delay values thereof in a tuning mode, wherein when the fine and replica fine delay lines are set as maximum and minimum delay values thereof, respectively, one more delay unit is set to be activated in the replica coarse delay line than in the coarse delay line, in the tuning mode, wherein when the fine and replica fine delay lines are set as minimum and maximum delay values thereof, respectively, one more delay unit is set to be activated in the coarse delay line than the replica coarse delay line In accordance with embodiments of the present invention, it is possible to adjust a maximum delay value of a fine delay line to be approximately equal to a delay value of one of coarse delay units in a course delay line.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween. Furthermore, when it is described that one "comprises" (or "includes") or "has" some elements, it should be understood that it may comprise (or include) or has only those elements, or it may comprise (or include) or have other elements as well as those elements if there is no specific limitation. The terms of a singular form may include plural forms unless otherwise stated.

Figure 2:
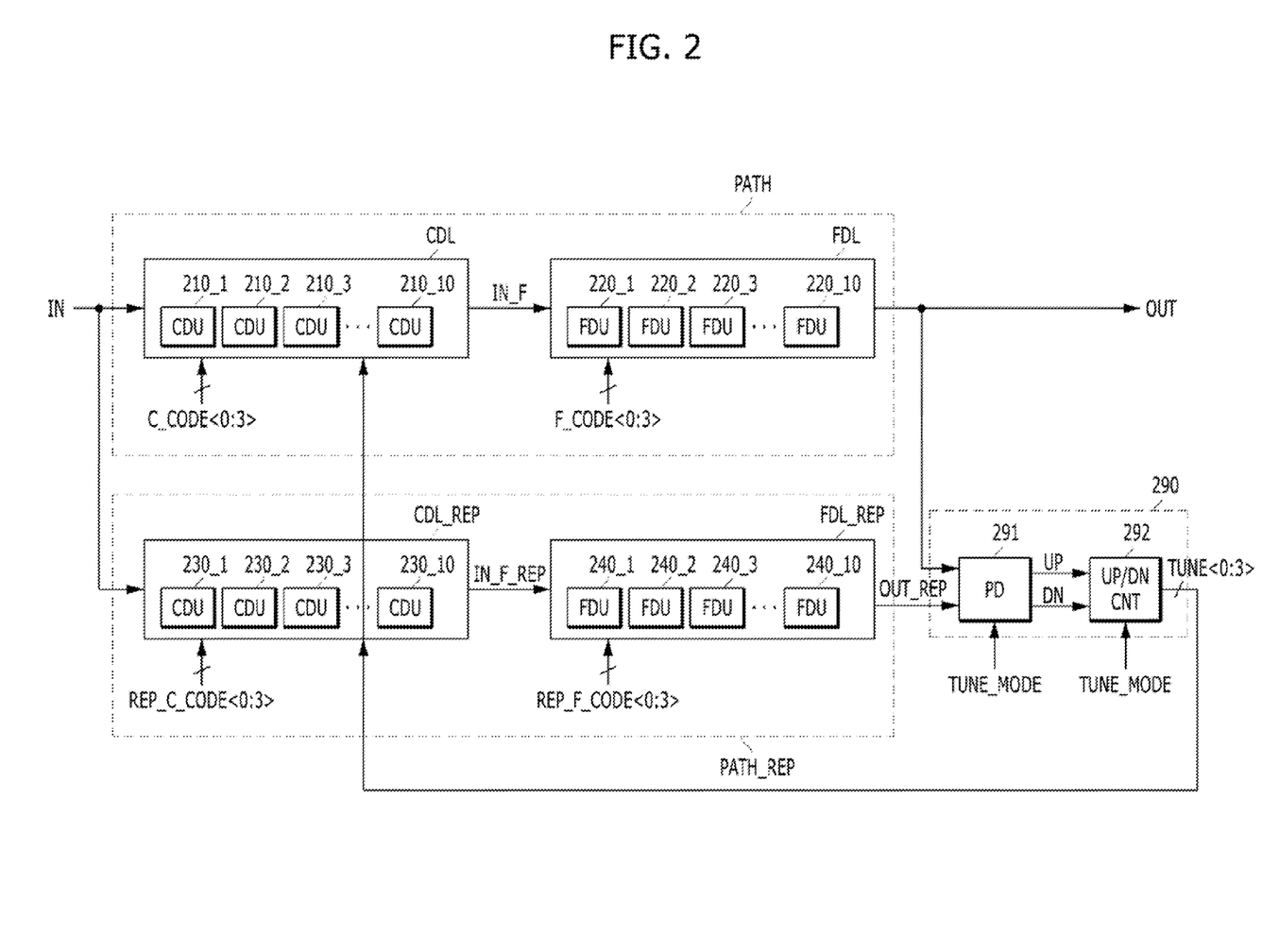
FIG. 2 is a configuration diagram of a delay circuit in accordance with an embodiment of the present invention.

FIG. 2 is a configuration diagram of a delay circuit accordance with an embodiment of the present invention.

Referring to FIG. 2, the delay circuit may include a delay path. PATH, a replica delay path PATH_REP, and a tuning unit 290.

The delay path PATH may include a coarse delay line (CDL) and a fine delay line (FDL) for delaying an input signal IN and generating an output signal OUT.

The coarse delay line CDL may include a plurality of coarse delay units (CDU) 210_1 to 210_10. Each of the coarse delay units 210_1 to 210_10 may have a large delay value. For example, each of the coarse delay units 210_1 to 210_10 may have a delay value of 10. Among the coarse delay units 210_1 to 210_10, the number of coarse delay units used to delay the input signal IN may be determined by coarse delay setting codes C_CODE<0:3>. Respective delay values of the coarse delay units 210_1 to 210_10 may be finely adjusted by tuning codes TUNE<0:3>.

The fine delay line FDL may include a plurality of fine delay units (FDU) 220_1 to 220_10. Each of the fine delay units 220_1 to 220_10 may have a small delay value. For example, each of the fine delay units 220_1 to 220_10 may have a delay value of 1. Among the fine delay units 220_1 to 220_10, the number of fine delay units used to delay an input signal IN_F of the fine delay line FDL may be determined by fine delay setting codes F_CODE<0:3>.

The replica delay path PATH_REP may include a replica coarse delay line CDL_REP and a replica fine delay line FDL_REP for delaying the input signal IN and generating a replica output signal OUT_REP.

The replica coarse delay line CDL_REP may be designed similarly to the coarse delay line CDL. The replica coarse delay line CDL_REP may include a plurality of replica coarse delay units (CDU) 230_1 to 230_10, similar to the coarse delay line CDL. Each of the replica coarse delay units 230_1 to 230_10 may have approximately the same delay value as that of each of the coarse delay units 210_1 to 210_10, for example, 10. Among the replica coarse delay units 230_1 to 230_10, the number of replica coarse delay units used to delay the input signal IN may be determined by replica coarse delay setting codes REP_C_CODE<0:3>. Respective delay values of the plurality of replica coarse delay units 230_1 to 230_10 may be finely adjusted by the tuning codes TUNE<0:3>.

The replica fine delay line FDL_REP may be designed similar to the fine delay line FDL. The replica fine delay line FDL_REP may include a plurality of replica fine delay units (FDU) 240_1 to 240_10, similar to the fine delay line FDL. Each of the replica fine delay units 240_1 to 240_10 may have approximately the same delay value as that of each of the fine delay units 220_1 to 220_10, for example, 1. Among the replica fine delay units 240_1 to 240_10, the number of replica fine delay units used to delay an input signal IN_F_REP of the replica fine delay line FDL_REP may be determined by replica fine delay setting codes REP_F_CODE<0:3>.

The tuning unit 290 may be activated in a tuning mode in which a tuning mode signal TUNE_MODE is activated, compare a phase of the output signal OUT of the delay path PATH with a phase of the replica output signal OUT_REP of the replica delay path PATH_REP, and generate the tuning codes TUNE<0:3>. The tuning unit 290 may include a phase comparator (PD) 291 that compares the phases of the signals OUT and OUT_REP with each other, and an up/down counter (UP/DN CNT) 292 that increases/decreases a value of the tuning codes TUNE<0:3> based on a phase comparison result UP or DN of the phase comparator 291. The phase comparator 291 and the up/down counter 292 may be activated to operate only when the tuning mode signal TUNE_MODE has been activated, and may be deactivated when the tuning mode signal TUNE_MODE has been deactivated. When the tuning mode signal TUNE_MODE is deactivated, the value of the tuning codes TUNE<0:3> may be fixed as a last value when the tuning mode signal TUNE_MODE has been activated.

In the embodiment of FIG. 2, the delay values of the coarse delay units 210_1 to 210_10 and the replica coarse delay units 230_1 to 230_10 are finely adjusted by the tuning codes TUNE<0:3>. However, in another embodiment which is different from the embodiment of FIG. 2, the delay values of the fine delay units 220_1 to 220_10 and the replica fine delay units 240_1 to 240_10 can be also finely adjusted by using the tuning codes TUNE<0:3> so that a maximum delay value of the fine delay line FDL may be adjusted to be approximately equal to a delay value of one of the coarse delay units 210_1 to 210_10 in the coarse delay line CDL.

Figure 3:
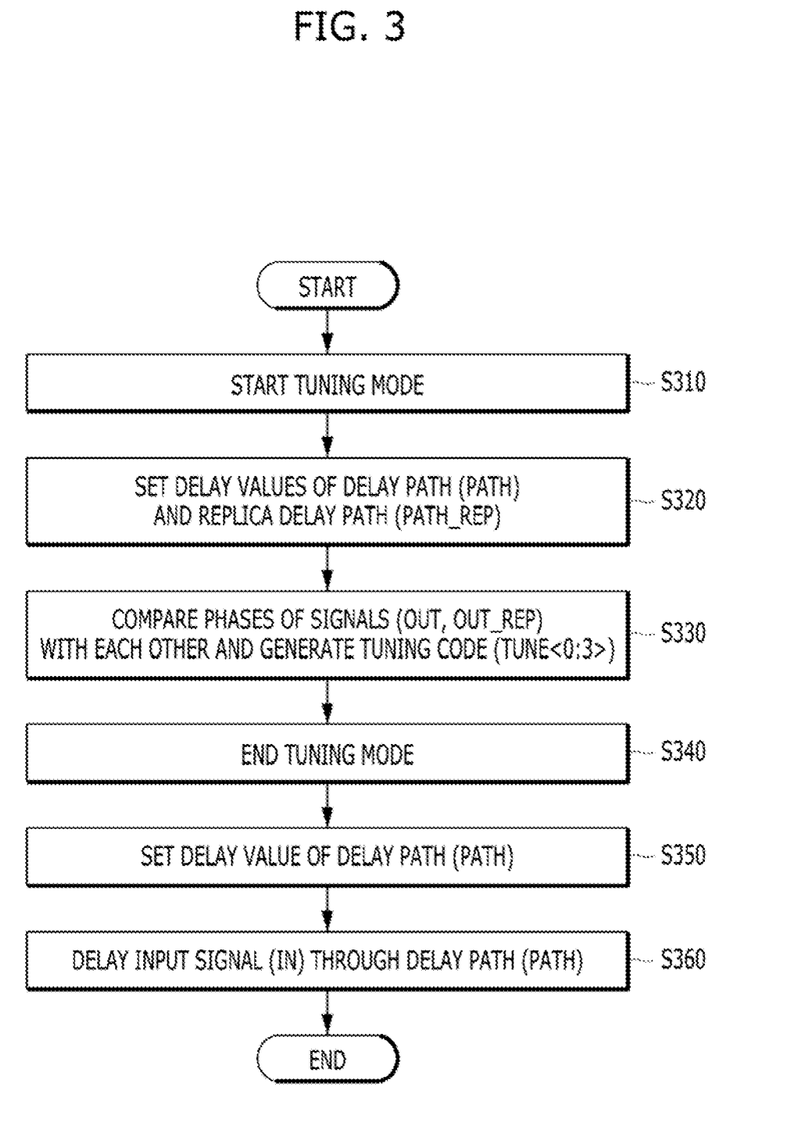
FIG. 3 is a diagram illustrating an operation of a delay circuit of FIG. 2.

FIG. 3 is a diagram illustrating the operation of the delay circuit of FIG. 2. With reference to FIG. 2 and FIG. 3, the operation of the delay circuit will be described.

Referring to FIG. 3, the tuning mode signal TUNE_MODE is activated, so that the tuning mode may be started (S310). In response to the activation of the tuning mode signal TUNE_MODE, the tuning unit 290 may be activated. For the tuning mode, the input signal IN may be inputted as a periodic wave such as a clock. Since the input signal IN provides many transition points in the output signal OUT and the replica output signal OUT_REP, the tuning unit 290 may compare the phases of the two signals OUT and OUT_REP with each other several times.

In the tuning mode, the delay values of the delay path PATH and the replica delay path PATH_REP may be set as (1) or (2) below (S320). The setting of the delay values may be performed by adjusting the values of the coarse delay setting codes C_CODE<0:3>, the fine delay setting codes F_CODE<0:3>, the replica coarse delay setting codes REP_C_CODE<0:3>, and the replica fine delay setting codes REP_F_CODE<0:3>.

(1) The fine delay line FDL is set as a maximum delay value. For example, 10 fine delay units 220_1 to 220_10 are set to be used. The coarse delay line CDL is set as the sum of N unit delay values (N is an integer equal or more than 0 and a unit delay value is a delay value of one of the coarse delay units 210_1 to 210_10). For example, three of the coarse delay units 210_1 to 210_10 are set to be used. The replica fine delay line FDL_REP is set as a minimum delay value. For example, 10 replica fine delay units 240_1 to 240_10 are set not to be used, that is, as a delay value of 0. The replica coarse delay line is set as the sum of N+1 unit delay values. For example, four of the replica coarse delay units 230_1 to 230_10 are set to be used in the delay.

(2) The fine delay line FDL is set as a minimum delay value. For example, 10 fine delay units 220_1 to 220_10 are set not to be used, that is, as a delay value of 0. The coarse delay line CDL is set as the sum of (N+1) unit delay values. For example, four of the coarse delay units 210_1 to 210_10) are set to be used. The replica fine delay line FDL_REP is set as a maximum delay value. For example, 10 replica fine delay units 240_1 to 240_10 are set to be used. The replica coarse delay line is set as the sum of N unit delay values. For example, three of the replica coarse delay units 230_1 to 230_10 are set to be used.

After the setting of the delay values of the delay path PATH and the replica delay path PATH_REP is complete, the tuning unit 290 may compare the phases of the output signals OUT and OUT_REP with each other and generate the tuning codes TUNE<0:3> (S330). For example, the delay values of the delay path PATH and the replica delay path PATH_REP have been set as (1) above. When it is detected by the phase comparator 291 that the phase of the output signal OUT is ahead of the phase of the replica output signal OUT_REP, the maximum delay value of the fine delay line FDL is smaller than the delay value of one of the replica coarse delay units 230_1 to 230_10. Accordingly, the up/down counter 292 may adjust the tuning codes TUNE<0:3> such that the delay values of the coarse delay units 210_1 to 210_10 and the replica coarse delay units 230_1 to 230_10 are decreased. However, when it is detected by the phase comparator 291 that the phase of the output signal OUT is behind the phase of the replica output signal OUT_REP, it represents that the maximum delay value of the fine delay line FDL is larger than the delay value of one of the replica coarse delay units 230_1 to 230_10. Accordingly, the up/down counter 292 may adjust the tuning codes TUNE<0:3> such that the delay values of the coarse delay units 210_1 to 210_10 and the replica coarse delay units 230_1 to 230_10 increase. After the operation for increasing/decreasing the value of the tuning codes TUNE<0:3> is repeated by the tuning unit 290 several times, the maximum value of the fine delay line FDL and the replica fine delay line FDL_REP may be adjusted to be approximately equal to one delay value of the coarse delay units 210_1 to 210_10 and the replica coarse delay units 230_1 to 230_10.

After the adjustment of the tuning codes TUNE<0:3> is repeated by the tuning unit 290 several times, the tuning mode signal TUNE_MODE is deactivated, so that the tuning mode may end (S340). When the tuning mode is ended, the tuning unit 290 may be deactivated and the tuning codes TUNE<0:3> may be fixed without a change.

Then, the delay value of the delay path PATH is set as a desired delay value (S350), and an operation of a normal mode, in which the input signal IN is delayed by the desired delay value through the delay path PATH, may be performed (S360). In the normal mode, the input signal IN may be any signal required to be delayed, and the input signal N need not be a periodic wave such as a dock as in the tuning mode. Since the replica delay path PATH_REP is used for tuning of the delay path PATH, the replica delay path PATH_REP may not be used in the normal mode.

Figure 4:
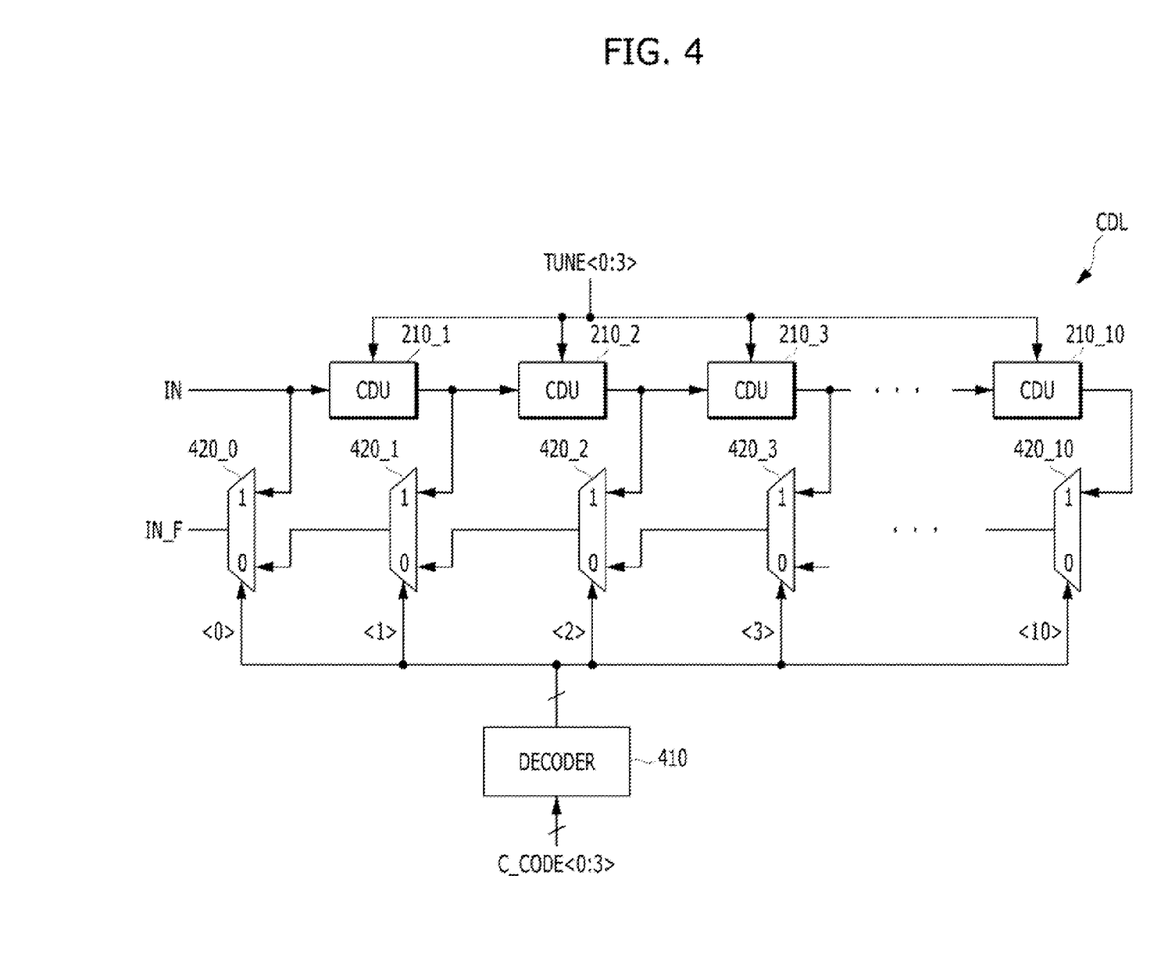
FIG. 4 is a configuration diagram of an embodiment of a coarse delay line CDL of FIG. 2.

FIG. 4 is a configuration diagram of an embodiment of the coarse delay line CDL of FIG. 2. The replica coarse delay line CDL_REP of FIG. 2 may also be configured similarly to the embodiment of FIG. 4.

Referring to FIG. 4, the coarse delay line CDL may include the coarse delay units 210_1 to 210_10, a decoder 410, and multiplexers 420_0 to 420_10.

The decoder 410 may decode the coarse delay setting codes C_CODE<0:3> and generate 11 bit-signals <0> to <10>. The decoder 410 may generate one of the 11 bit-signals <0> to <10> as '1' and the other signals as '0' based on the value of the coarse delay setting codes C_CODE<0:3>.

The multiplexers 420_0 to 420_10 may select and output one of signals of terminals 0 and 1 in response to a signal corresponding thereto among the 11 bit-signals <0> to <10>. By the operation of the multiplexers 420_0 to 420_10, the number of the coarse delay units 210_1 to 210_10, through which the input signal IN of the coarse delay line CDL is outputted as the output signal IN_F of the coarse delay line CDL, may be from 0 to 10. For example, when the signal <3> has a value of '1' and the signals <0> to <2> and <4> to <10> have a value of '0', the signal IN may be delayed by three coarse delay units 210_1 to 210_3 and outputted as the signal IN_F. When the signal <10> has a value of '1' and the signals <0> to <9> have a value of '1', the signal IN may be delayed by 10 coarse delay units 210_1 to 210_10 and outputted as the signal IN_F.

Respective delay values of the coarse delay units 210_1 to 210_10 may be adjusted by the tuning codes TUNE<0:3> which will be described in detail with reference to FIG. 5.

Figure 5:
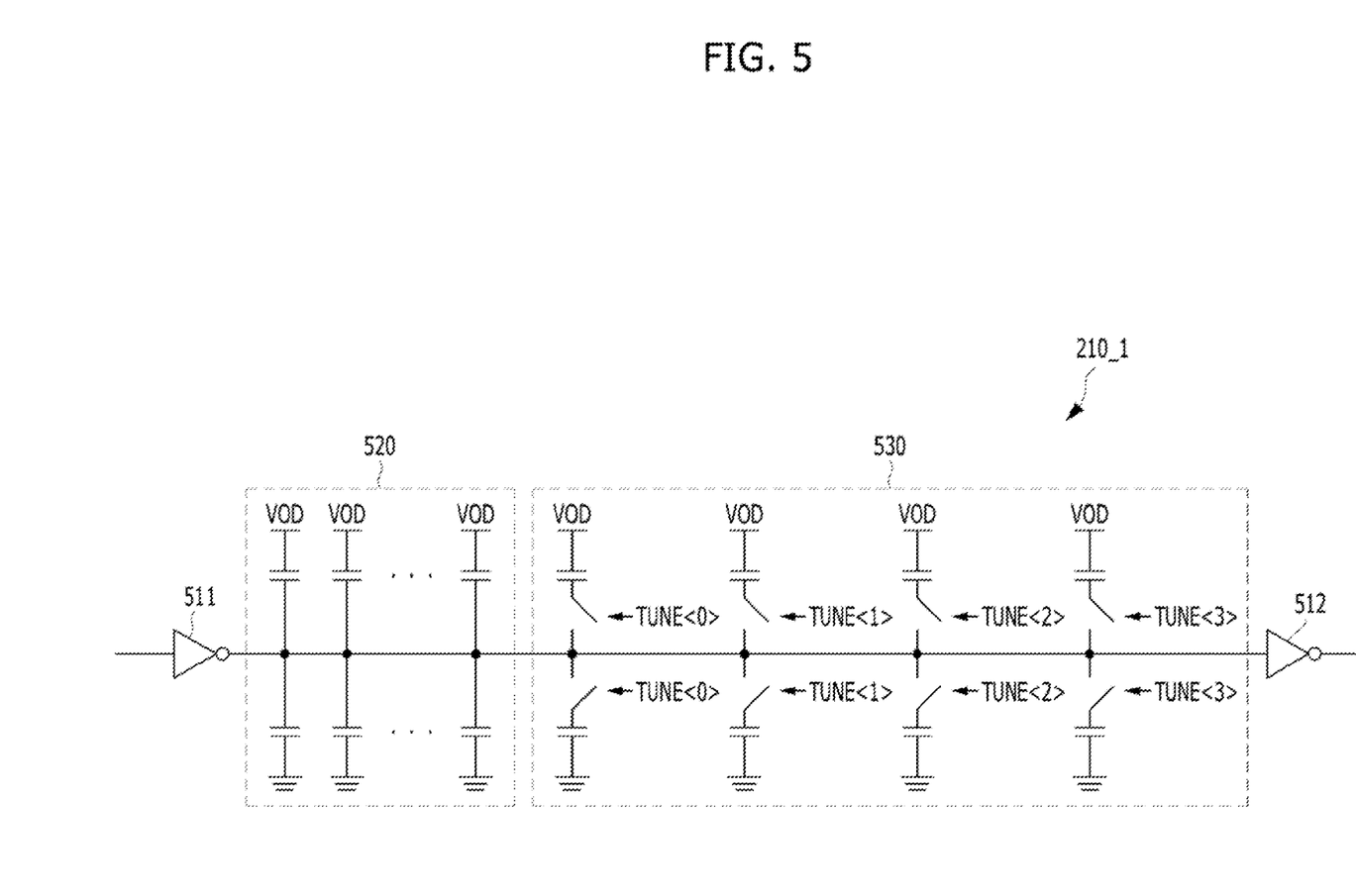
FIG. 5 is a configuration diagram of an embodiment of a coarse delay unit 210_1 of FIG. 4.

FIG. 5 is a configuration diagram of an embodiment of the to coarse delay unit 210_1 of FIG. 4. The other coarse delay units 210_2 to 210_10 and the replica coarse delay units 230_1 to 230_10 may be configured similar to the embodiment of FIG. 5.

Referring to FIG. 5, the coarse delay unit 210_1 may include inverters 511 and 512, first capacitors 520, and second capacitors 530.

The first capacitors 520 and the second capacitors 530 may be used in order to delay signals passing through the coarse delay unit 210_1. All the first capacitors 520 may be used in signal delay. However, among the second capacitors 530, the number of capacitors to be used for signal delay may be adjusted by the tuning codes TUNE<0:3>. For example, when the tuning codes TUNE<0:3> are (1, 1, 0, and 0), four of the second capacitors 530 may be used for signal delay. When the tuning codes TUNE<0:3> are (1, 0, 0, and 0), two of the second capacitors 530 may be used for signal delay.

Since the number of the second capacitors 530 to be used for signal delay is adjusted by the tuning codes TUNE<0:3>, the delay value of the coarse delay unit 210_1 may be adjusted by the tuning codes TUNE<0:3>.

Figure 6:
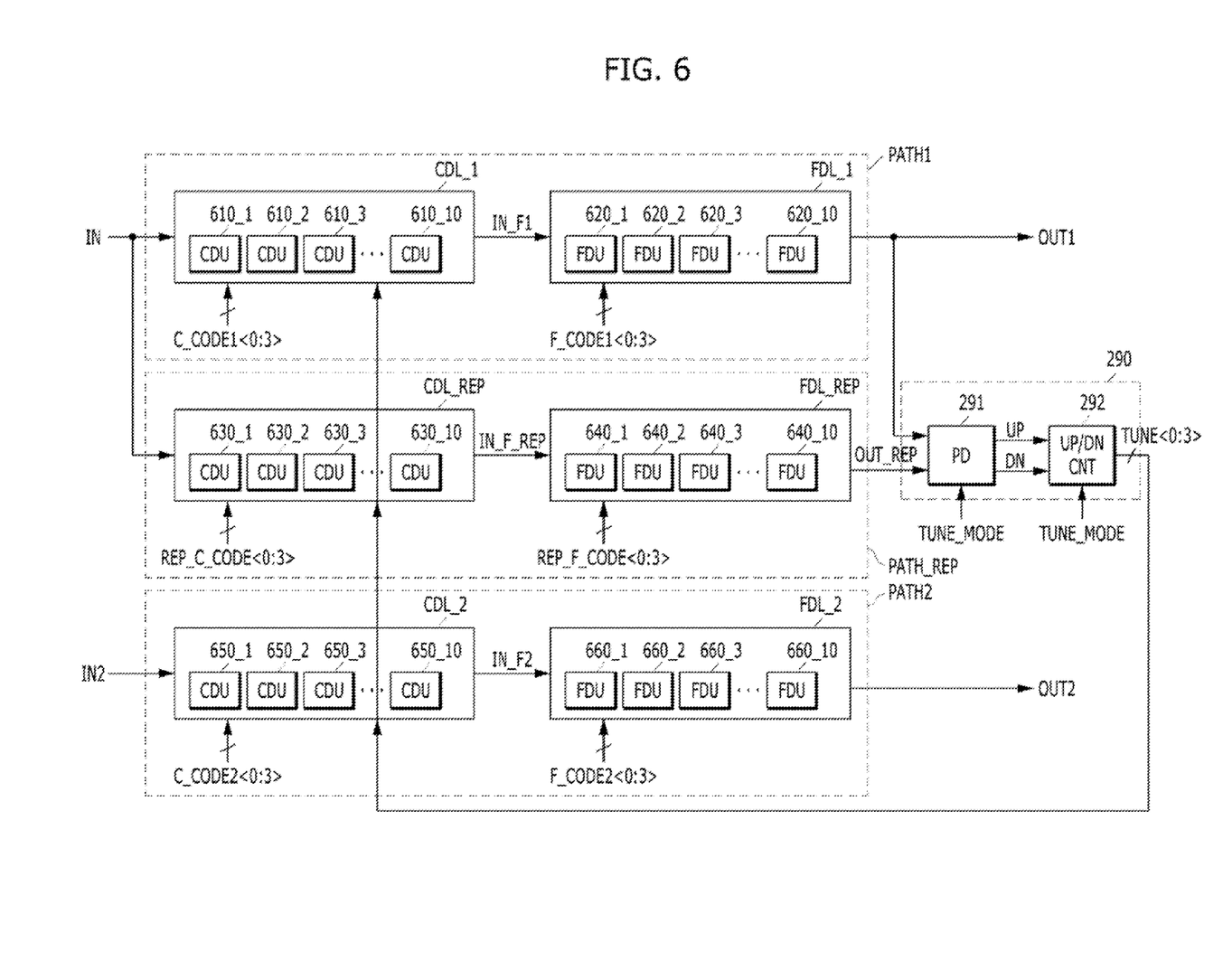
FIG. 6 is a configuration diagram of a delay circuit in accordance with another embodiment of the present invention.

FIG. 6 is a configuration diagram of a delay circuit in accordance with another embodiment of the present invention.

Referring to FIG. 6, the delay circuit may include a first delay path PATH1, a second delay path PATH2, a replica delay path PATH_REP, and a tuning unit 290.

The first delay path PATH1 may delay a first input signal IN1 and generate a first output signal OUT1. The first delay path PATH1 may include a first coarse delay line CDL_1 and a first fine delay line FDL_1.

The first coarse delay line CDL_1 may include a plurality of first coarse delay units (CDU) 610_1 to 610_10. Each of the first coarse delay units 610_1 to 610_10 may have a large delay value. For example, each of the first coarse delay units 610_1 to 610_10 may have a delay value of 10. Among the first coarse delay units 610_1 to 610_10, the number of first coarse delay units used to delay the first input signal IN1 may be determined by first coarse delay setting codes C_CODE1<0:3>. Respective delay values of the first coarse delay units 610_1 to 616_10 may be finely adjusted by tuning codes TUNE<0:3>.

The first fine delay line FDL_1 may include a plurality of first fine delay units (FDU) 620_1 to 620_10. Each of the first fine delay units 620_1 to 620_10 may have a small delay value. For example, each of the first fine delay units 620_1 to 620_10 may have a delay value of 1. Among the first fine delay units 620_1 to 620_10, the number of first fine delay units used to delay an input signal IN_F1 of the first fine delay line FDL_1 may be determined by first fine delay setting codes F_CODE1<0:3>.

The replica delay path PATH_REP may include a replica coarse delay line CDL_REP and a replica fine delay line FDL_REP for delaying the first input signal IN1 and generating a replica output signal OUT_REP.

The replica coarse delay line CDL_REP may be designed similarly to the first coarse delay line CDL_1. The replica coarse delay line CDL_REP may include a plurality of replica coarse delay units (CDU) 630_1 to 630_10, similar to the first coarse delay line CDL_1. Each of the replica coarse delay units 630_1 to 630_10 may have approximately the same delay value as that of each of the first coarse delay units 610_1 to 610_10 for example, 10. Among the replica coarse delay units 630_1 to 630_10, the number of replica coarse delay units used to delay the first input signal IN1 may be determined by replica coarse delay setting codes REP_C_CODE<0:3>. Respective delay values of the plurality of replica coarse delay units 630_1 to 630_10 may be finely adjusted by the tuning codes TUNE<0:3>.

The replica fine delay line FDL_REP may be designed similar to the first fine delay line FDL_1. The replica fine delay line FDL_REP may include a plurality of replica fine delay units (FDU) 640_1 to 640_10 similar to the first fine delay line FDL_1. Each of the replica fine delay units 640_1 to 640_10 may have approximately the same delay value as that of each of the first fine delay units 620_1 to 620_10, for example, 1. Among the replica fine delay units 640_1 to 640_10, the number of replica fine delay units used to delay an input signal IN_F_REP of the replica fine delay line FDL_REP may be determined by replica fine delay setting codes REP_F_CODE<0:3>.

The tuning unit 290 may be activated in a tuning mode in which a tuning mode signal TUNE_MODE is activated, compare a phase of the first output signal OUT1 of the first delay path PATH1 with a phase of the replica output signal OUT_REP of the replica delay path PATH_REP, and generate the tuning codes TUNE<0:3>. The tuning unit 290 may include a phase comparator (PD) 291 that compares the phases of the signals OUT1 and OUT_REP with each other, and an up/down counter (UP/DN CIT) 292 that increases/decreases a value of the tuning codes TUNE<0:3> based on a phase comparison result UP or DN of the phase comparator 291. The phase comparator 291 and the up/down counter 292 may be activated to operate only when the tuning mode signal TUNE_MODE has been activated, and may be deactivated when the tuning mode signal TUNE_MODE has been deactivated. When the tuning mode signal TUNE_MODE is deactivated, the value of the tuning codes TUNE<0:3> may be fixed as a last value when the tuning mode signal TUNE_MODE has been activated.

The second delay path PATH2 may delay a second input signal IN2 and generate a second output signal OUT2. The second delay path PATH2 may include a second coarse delay line CDL_2 and a second fine delay line FDL_2.

The second coarse delay line CDL_2 may include a plurality of second coarse delay units (CDU) 650_1 to 650_10. Each of the second coarse delay units 650_1 to 650_10 may have a large delay value. For example, each of the second coarse delay units 650_1 to 650_10 may have a delay value of 10. Among the second coarse delay units 650_1 to 650_10, the number of second coarse delay units used to delay the second input signal IN2 may be determined by second coarse delay setting codes C_CODE2<0:3>. Respective delay values of the plurality of second coarse delay units 650_1 to 650_10 may be finely adjusted by the tuning codes TUNE<0:3>.

The second fine delay line FDL_2 may include a plurality of second fine delay units (FDU) 660_1 to 660_10. Each of the second fine delay units 660_1 to 660_10 may have a small delay value. For example, each of the second fine delay units 660_1 to 660_10 may have a delay value of 1. Among the second fine delay units 660_1 to 660_10, the number of second fine delay units used to delay an input signal IN_F2 of the second fine delay line FDL_2 may be determined by second fine delay setting codes F_CODE2<0:3>.

The first delay path PATH1, the replica delay path PATH_REP, and the tuning unit 290 of FIG. 6 correspond to the delay path PATH, the replica delay path PATH_REP, and the tuning unit 290 of FIG. 2, and may operate in the same manner. That is, in the tuning mode, the tuning codes TUNE<0:3> may be generated by the operations of the first delay path PATH1, the replica delay path PATH_REP, and the tuning unit 290. The first delay path PATH1 tuned by the tuning codes TUNE<0:3> after the end of the tuning mode may perform an to operation for delaying the first input signal IN1. The second delay path PATH2 does not operate in the tuning mode, and the second delay path PATH2, tuned by the tuning codes TUNE<0:3> after the end of the tuning mode, may perform an operation for delaying the second input signal IN2.

FIG. 6 illustrates an example in which the number of signals IN1 and IN2 to be delayed by the delay circuit is 2. However, when the number of signals to be delayed by the delay circuit is increased, delay paths such as the second delay path PATH2 may be added.

Although various embodiments have been described for illustrative purposes, it will be apparent to those skilled in the art that various changes and modifications may be made without departing from the spirit and scope of the invention as defined in the following claims.

What is claimed is:

1. A delay circuit comprising:
a delay path including a fine delay line and a coarse delay line;
a replica delay path including a replica fine delay line and a replica coarse delay line; and
a tuning unit suitable for comparing a phase of a first signal obtained by delaying an input signal through the delay path with a phase of a second signal obtained by delaying the input signal through the replica delay path, and generating a tuning code in a tuning mode,
wherein, in the tuning mode, the delay path and the replica delay path are set as one of first and second ways (1) and (2),
wherein, as the first way (1) the fine delay line is set as a maximum delay value thereof, and the coarse delay line is set as a delay value of N delay units thereof, and the replica fine delay line is set as a minimum delay value thereof, and the replica coarse delay line is set as a delay value of N+1 delay units thereof, wherein the N is an integer equal to or more than 0,
wherein, as the second way (2), the fine delay line is set as a minimum delay value thereof, and the coarse delay line is set as a delay value of N+1 delay units thereof, and the replica fine delay line is set as a maximum delay value thereof, and the replica coarse delay line is set as a delay value of N delay units thereof.

2. The delay circuit of claim 1, wherein delay values of the coarse delay line and the replica coarse delay line are tuned by the tuning code.

3. The delay circuit of claim 2, wherein each of the coarse delay line and the replica coarse delay line comprises:
a plurality of coarse delay units as a delay unit thereof,
wherein a number of coarse delay units to be used in the delaying of the input signal among the plurality of coarse delay units is determined by a corresponding coarse delay setting code, and a delay value of each of the plurality of coarse delay units is adjusted by the tuning code.

4. The delay circuit of claim 3, wherein each of the plurality of coarse delay units comprises:
a plurality of capacitors, and
wherein a number of capacitors to be used in the delaying of the input signal among the plurality of capacitors is determined by the tuning code.

5. The delay circuit of claim 1, wherein delay values of the fine delay line and the replica fine delay line are adjusted by the tuning code.

6. The delay circuit of claim 1, wherein the tuning unit comprises:
a phase comparator suitable for comparing the phase of the first signal with the phase of the second signal; and
an up/down counter suitable for generating the tuning code in response to a comparison result of the phase comparator.

7. The delay circuit of claim 1, wherein, when the tuning mode is ended, the tuning unit is deactivated and a value of the tuning code is fixed.

8. The delay circuit of claim 1, wherein the input signal inputted through the delay path and the replica delay path in the tuning mode includes a periodic wave.

9. A delay circuit comprising:
a first delay path including a first fine delay line and a first coarse delay line for delaying a first input signal and generating a first output signal;
a second delay path including a second fine delay line and a second coarse delay line for delaying a second input signal and generating a second output signal;
a replica delay path including a replica fine delay line and a replica coarse delay line for delaying the first input signal and generating a replica output signal; and
a tuning unit suitable for comparing a phase of the first output signal with a phase of the replica output signal, and generating a tuning code for tuning delay values of the first coarse delay line, the second coarse delay line, and the replica coarse delay line in a tuning mode.

10. The delay circuit of claim 9, wherein, in the tuning mode, the first delay path and the replica delay path are set as one of first and second ways (1) and (2),
wherein, as the first way (1), the first fine delay line is set as a maximum delay value thereof, and the first coarse delay line is set as a delay value of N delay units thereof, and the replica fine delay line is set as a minimum delay value thereof, and the replica coarse delay line is set as a delay value of N+1 delay units thereof, wherein the N is an integer equal to or more than 0,
wherein, as the second way (2), the first fine delay line is set as a minimum delay value thereof, and the first coarse delay line is set as a delay value of N+1 delay units thereof, and the replica fine delay line is set as a maximum delay value thereof, and the replica coarse delay line is set as a delay value of N delay units thereof.

11. The delay circuit of claim 10, wherein each of the first coarse delay line, the second coarse delay line, and the replica coarse delay line comprises:
a plurality of coarse delay units as a delay unit thereof,
wherein a number of coarse delay units to be used in the delay of the first or second input signal among the plurality of coarse delay units is determined by a corresponding coarse delay setting code, and a delay value of each of the plurality of coarse delay units is adjusted by the tuning code.

12. The delay circuit of claim 11, wherein each of the plurality of coarse delay units comprises:
a plurality of capacitors,
wherein a number of capacitors to be used in the delay of the first or second input signal among the plurality of capacitors is determined by the tuning code.

13. The delay circuit of claim 9, wherein the tuning unit comprises:
a phase comparator suitable for comparing the phase of the first output signal with the phase of the replica output signal; and an up/down counter suitable for generating the tuning code in response to a comparison result of the phase comparator.

14. The delay circuit of claim 9, wherein, when the tuning mode is ended, the tuning unit is deactivated and a value of the tuning code is fixed.

15. The delay circuit of claim 9, wherein, in the tuning mode, the first input signal includes a periodic wave.

16. A delay circuit comprising:
a delay path including a fine delay line and a coarse delay line, wherein the coarse delay line includes a plurality of delay units and the fine delay line corresponds to one of the delay units;
a replica delay path including a replica fine delay line and a replica coarse delay line and configured approximately the same as the delay path; and
a tuning unit suitable for comparing output signals of the delay path and the replica delay path and generating a tuning code for tuning delay values thereof in a tuning mode,
wherein when the fine and replica fine delay lines are set as maximum and minimum delay values thereof, respectively, one more delay unit is set to be activated in the replica coarse delay line than in the coarse delay line, in the tuning mode,
wherein when the fine and replica fine delay lines are set as minimum and maximum delay values thereof, respectively, one more delay unit is set to be activated in the coarse delay line than in the replica coarse delay line.

* * * * *